United States Patent [19]

Kliger et al.

[11] 4,450,410
[45] May 22, 1984

[54] PHASE-LOCK LOOP CONTROL CIRCUITRY

[75] Inventors: Isaac E. Kliger, Lexington; William C. Brown, Jr., Littleton; David S. Goldstein, Framingham, all of Mass.

[73] Assignee: Raytheon Company, Lexington, Mass.

[21] Appl. No.: 356,698

[22] Filed: Mar. 3, 1982

[51] Int. Cl.³ .................... H03D 13/00; H03L 7/08
[52] U.S. Cl. ...................................... 328/155; 331/25
[58] Field of Search ......................... 328/155; 331/25

[56] References Cited

U.S. PATENT DOCUMENTS 4,023,116  5/1977  Alfke et al. ..................... 328/155
4,122,404 10/1978  Fuhrman ........................ 328/155
4,375,694  3/1983  Kuhn ............................. 328/155

OTHER PUBLICATIONS

"Test Your Charge-Pump Phase Detectors," Dr. William Egan and Eugene Clark, GTE Sylvania, P.O. Box 188, Mountain View, CA 94042.
Electronic Design 12, Jun. 7, 1978, pp. 134, 135, 136, 137.
Motorola Specification Sheet MC12040-MC12540.

Primary Examiner—John S. Heyman
Attorney, Agent, or Firm—Philip J. McFarland; Joseph D. Pannone

[57] ABSTRACT

Circuitry for controlling a phase-lock loop using a charge-pump phase detector is shown to comprise a phase detector network in combination with an operational amplifier connected to selected output signals from such network to produce a bipolar D.C. signal indicative of the phase difference between signals applied to such network, one of the signals being at a frequency half that of the other.

1 Claim, 3 Drawing Figures

PHASE-LOCK LOOP CONTROL CIRCUITRY

BACKGROUND OF THE INVENTION

This invention pertains generally to a phase-lock loop control loops, and, in particular, to a technique for improving the transfer characteristics of a wide band phase comparator logic network intended for use at high frequency with close phase control.

As is known, emitter coupled logic (ECL) phase detectors have been successfully utilized to close phase lock loops operating at intermediate frequencies of 5 to 30 MHz. One known ECL phase detector manufactured by Motorola Company and designated the Model No. 12040 phase comparator logic network, operates to compare the relative timing between positive-going transitions of a reference (R) and a signal (S) input waveform to generate either an up (U) or down (D) output signal having a duty cycle proportional to the phase difference between the R and S input waveforms. In practice, an operational amplifier then is used to combine and integrate the output signal from the phase detector to provide the requisite control signal for the controlled oscillator in the loop. Although networks such as the Motorola 12040 phase comparator logic network have been successfully utilized to control loops in the frequency range of 5 to 30 MHz when any known network is operated at higher frequencies (say in the order of 100 MHz), propagation delays within the network cause gain distortion, especially in the critical region where there is little, if any, phase difference between a reference signal and the signal out of the controlled oscillator. Such gain distortion varies from network to network and, unless compensated for, will result in an unacceptable increase in the level of phase modulated noise sidebands which result in unsatisfactory operation.

SUMMARY OF THE INVENTION

With this background of the invention in mind, it is therefore a primary object of this invention to provide an improved phase-lock network to compensate for propagation delays within an ECL phase comparator logic network.

It is another object of this invention to provide a wide band linear phase detector suitable for controlling high frequency phase lock loops.

These and other objects of the invention are attained generally by providing: (a) a phase comparator logic network to which a reference signal whose frequency is half that of a signal out of a controlled oscillator is applied; and (b) an operational amplifier to which the output of such network is, through an impedance matching and filter network, applied. The impedance matching and filter network prevents any relatively narrow output pulses from the phase comparator logic network from being applied directly to the operational amplifier, and, additionally, conditions the input signals to the operational amplifier in which input signals are combined and integrated to produce a control signal of the form $(2U+D-3\overline{D})$, where U, D and $\overline{D}$ are outputs of the phase comparator logic network. The control signal then is applied to the controlled oscillator with the result that again distortion is effectively eliminated when operation at high frequencies is desired.

BRIEF DESCRIPTION OF THE DRAWINGS

For a more complete understanding of this invention, reference is now made to the following description of the accompanying drawings, wherein.

DESCRIPTION OF THE PREFERRED EMBODIMENT

Figure 1:
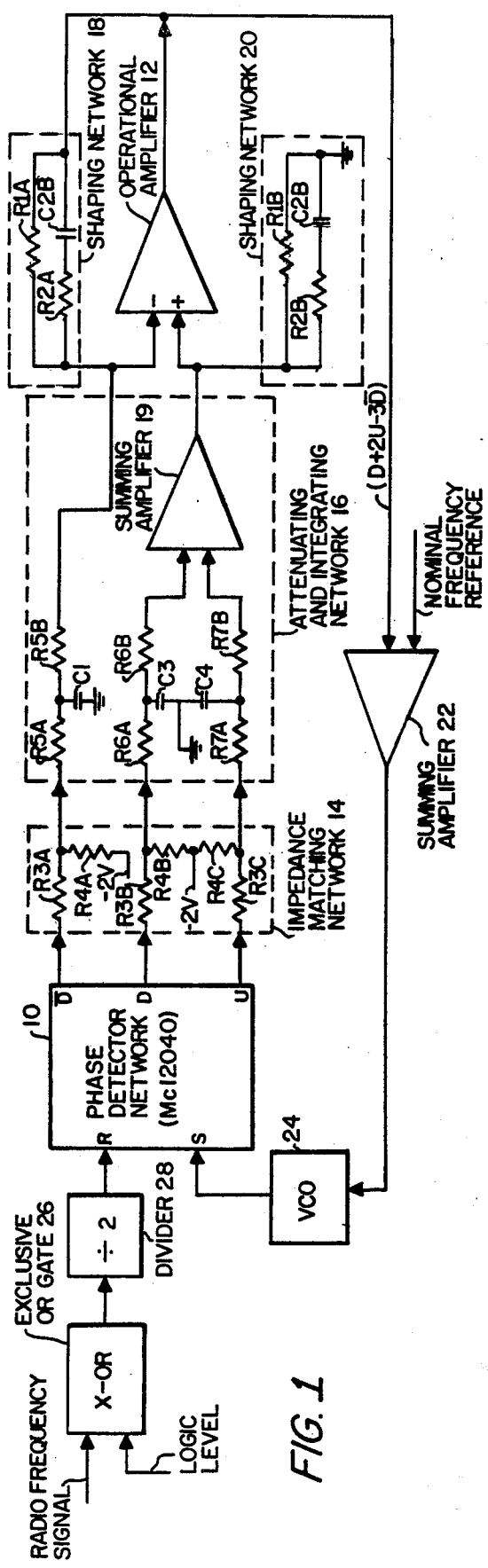
FIG. 1 is a diagram of a phase-lock loop control network according to this invention.

Before referring specifically to the FIGURES, reference is first made to the article "Test Your Charge-Pump Detectors" by Egan et al appearing in the Issue of June 7, 1978, of *Electronic Design* (published by Hayden Publishing Company, Inc., 50 Essex Street, Rochelle Park, N.J. 07662). In the cited article (and a following note by Breeze) methods for measuring and correcting "zero-phase" gain distortion at lower frequencies of operation of phase detector networks of the type here being considered. However, there is no suggestion in either the article or note that error due to propagation delays may be reduced.

It should also be noted that, for convenience of explanation, a particular type of phase detector network, the model MC12040 manufactured by Motorola Semiconductor Products, Inc., Phoenix, Ariz. is used. Briefly, the model 12040 is an integrated circuit containing a pair of bistable multivibrators and an associated logic network for determining the "lead" or "lag" phase relationship and the time difference between the leading edges of two waveforms applied, respectively, to input terminals designated hereinafter as the "R" and "S" inputs. The two applied waveforms must, according to the manufacturer, be at the same frequency when a phase measurement is to be made.

The logic network in the MC12040 controls operation in accordance with the following rules:

(1) The outputs U and D do not change if the inputs R and S do not change;

(2) The outputs U and D can change only in response to the rising edge of the input R and S waveforms;

(3) U and D are never simultaneously HIGH (logic level 1);

(4) U and D may simultaneously be LOW (logic level 0);

(5) The rising edge of the R waveform activates U when both U and D are LOW. The rising edge of the R waveform deactivates D when U is LOW and D is HIGH. The rising edge of the R waveform does not cause any changes in U or D when U is HIGH and D is LOW.

(6) The rising edge of the S waveform activates D when both U and D are LOW. The rising edge of the S waveform deactivates U when U is high and D is low. The rising edge of the S waveform does not cause any change in U or D when D is high and U is low.

When the interval between the leading edges of the "R" and "S" waveforms exceeds the time required to drive either one of the bistable multivibrators in the model MC12040 phase detector network, compliance with the foregoing rules produces either: (a) when "R"

leads "S", a rectangular wave at the "U" output terminal and a constant low level ("0") at the "D" output terminal; or (b) when "R" lags "S", a rectangular wave at the "D" output terminal and a constant low level ("0") at the "U" output terminal. In either case, the duty cycle of the rectangular wave produced is indicative of the difference in phase between the "R" and "S" waveforms.

It will be observed that, when a train of pulse signals is applied to one input terminal (say the "R" input) and a continuous signal is applied to the other input terminal (the "S" input) operation of the MC12040 phase detector is affected by past history. That is to say, the phase relationship (whether "leading" or "lagging") between the applied input signals as each pulse is extant establishes initial conditions for operation when the next following pulse occurs; such initial conditions in turn determine the order in which the bistable multivibrators then operate. Nonetheless, because phase error information is contained in the output duty cycle, defined as the ratio between the output pulse width and the total period, provision may be made to use the MC12040 in a stable phase-locked loop regardless of the order in which the bistable multivibrators operate. Thus, as recommended by the manufacturer, the $\overline{U}$ and $\overline{D}$ outputs of the bistable multivibrators may, respectively, be passed, through appropriate impedance matching and filtering circuitry, to the inverting and noninverting input terminals of an operational amplifier. However, it should be noted that the problem posed by propagation delays within the MC12040 is not solved, or ameliorated in any way, by the recommended circuitry. If, as would be the case when the phase difference between the "R" and "S" signals approaches zero, two actuating pulses are so closely spaced in time that one of the bistable multivibrators cannot complete a required reversal in state (in response to the first of such pulses) before the other bistable multivibrator receives the second of such pulses, it is evident that compliance with the rules of operation listed hereinbefore cannot be achieved. That is to say, the requisite rectangular wave cannot be produced at either the "U" output terminal (when "R" leads "S") or at the "D" output terminal (when "R" lags "S").

With the foregoing in mind, it may be seen that the preferred embodiment of the invention here contemplated comprises a phase detector 10 (here an MC12040 phase detector) feeding an operational amplifier 12 via an impedance matching network 14 and an attenuating and integrating network 16. A shaping circuit 18 and a shaping circuit 20 are also connected as shown between the input terminals and output terminals of the operational amplifier 12. The output of the latter amplifier here is connected, via a summing amplifier 22, to a voltage-controlled oscillator (VCO 24) which supplies the "S" signal to the phase detector network 10. A D.C. signal, designated "nominal frequency reference," is also applied to the summing amplifier 22 to set the VCO 24 to a nominal operating frequency.

The "R" input to the phase detector network 10 is formed, as shown, by impressing a radio frequency signal (either a continuous wave or pulse signal) on an exclusive OR gate 26 (X-OR 26) and dividing by a factor of 2 in a divider 28. X-OR 26 is arranged to receive a radio frequency signal (either a continuous or pulse signal) and a signal designated "logic level". Here the just-mentioned logic level signal is a D.C. signal that may be varied in any convenient manner (not shown) until the frequencies of the signal out of VCO 24 and the radio frequency signal into X-OR 26 are the same. The frequency of the signal on the "R" input terminal of phase detector network 10 is then one-half the frequency of the signal on the "S" input terminal. If now it be assumed that the radio frequency signal on X-OR 26 is in phase with the signal out of VCO 24, the rising edges of such signals will be coincident in time; consequently, such pulses cannot cause the bistable multivibrators in the phase detector network 10 to operate in accordance with the rules of operation set forth hereinbefore. There are, however, rising edges of the "S" waveform which are not in time coincidence with the rising edges of the signal out of the divider 28 which, in combination with the rising edges of the signals on the "R" input of the phase detector network 10, will allow operation of the bistable multivibrators in accordance with the rules set forth hereinbefore.

Figure 2:
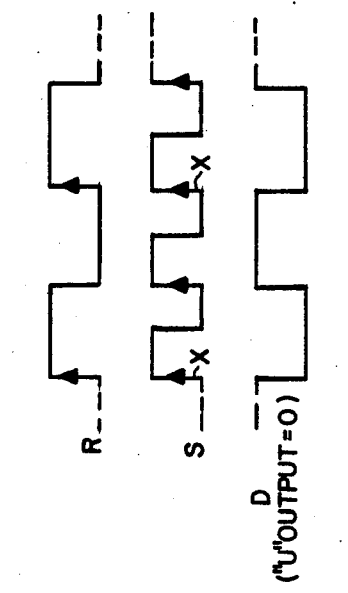
FIG. 2 is a timing diagram useful in understanding the operation of the phase-lock loop control network of FIG. 1.

The timing diagram shown in FIG. 2 is illustrative of the foregoing. Thus, as shown, the "R" input to the phase detector network 10 is a square wave having a period equal to one-half the period of a square wave impressed on the "S" input of that network. The rising edge of every other cycle of the latter waveform (marked with an "X") is shown to be coincident in time with a rising edge of the former waveform. The rising edges marked with "x" are ineffective, with the result that, when the radio frequency signal applied to the X-OR gate 26 is in phase with the "S" input, and steady state operation is achieved, the D and U output signals are as shown.

Figure 3:
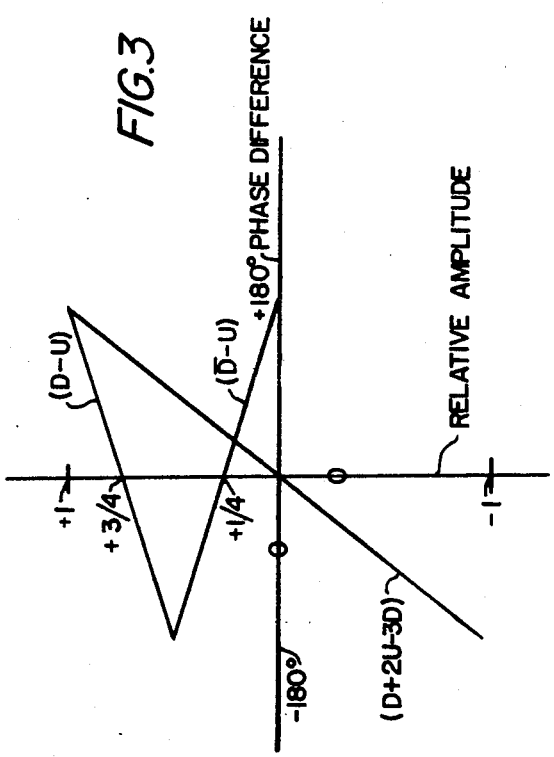
FIG. 3 is a sketch of transfer characteristics showing the rationale of the phase lock loop control network of FIG. 1.

The transfer characteristic shown in FIG. 3 and marked (D−U) shows how the integrated output (D−U) changes as the phase difference between the radio frequency signal applied to the X-OR gate 26 (FIG. 1) and the "S" input changes from −180° to +180°. As may be seen, when that phase difference is 0°, the integrated output is offset from the desired value of zero. Further, the transfer characteristic is not bipolar to distinguish between "lead" and "lag" conditions.

Fortunately, the transfer characteristic of the integrated ($\overline{D}$−U) output shown in FIG. 3 and the (D−U) output may be combined to obtain a transfer characteristic, T.C., which has no offset and is bipolar. Thus:

Eq. (1) $T.C.=(D-U)-3(\overline{D}-U)$.

Simplifying Eq. (1):

Eq. (2) $T.C.=D+2U-3\overline{D}$.

Referring now again to FIG. 1, it may be seen that the values of the resistors and capacitors in the attenuating and integrating network 16 may be proportioned to cause the signal on the noninverting terminal (after summing in summing amplifier 19) and the signal on the inverting terminal of the operational amplifier 12 to be consonant with the terms on the right hand side of Eq. (2) so that the transfer characteristic T.C. (FIG. 3) is achieved.

The circuit shown in FIG. 1 was built and successfully tested utilizing the components listed in Table 1.

TABLE 1

| | |
|---|---|
| R1 | 15.8 kilohms |
| R2 | 1.58 kilohms |
| R3 | 34 ohms |
| R4 | 15.8 ohms |
| R5 | 137 ohms |

TABLE 1-continued

| | |
|---|---|
| R6 | 412 ohms |
| R7 | 205 ohms |
| C1 | 300 pf |
| C2 | 100 pf |
| C3 | 100 pf |
| C4 | 200 pf |

Having described a preferred embodiment of this invention, it will now be apparent to those of skill in the art that many modifications may be made without departing from our inventive concepts. Thus, for example, while the component values specified in Table 1 were successfully utilized to close out a phase-lock loop at a frequency of 105 MHz, the component values could be easily changed, while maintaining the same relative values, to permit operation over any frequency band. It is felt, therefore, that this invention should not be restricted to its disclosed embodiment, but rather should be limited only by the spirit and scope of the appended claims.

What is claimed is:

1. In a control circuit using a charge-pump phase detector coupled to an operational amplifier to produce a bipolar D.C. signal indicative of the phase relationship between a first and a second radio frequency signal, such charge-pump phase detector having first and second inputs and three outputs incorporating a pair of bistable multivibrators actuated by the input signal and the second radio-frequency signal to produce signals designated D, U and $\overline{D}$, where D at said output and U are pulse signals representative of the set states of the bistable multivibrator and $\overline{D}$ is the complement of D, the duty cycles of the signals designated D, U and $\overline{D}$ being indicative of the difference in phase between the input signal and the second radio-frequency signal, the improvement comprising:

(a) frequency divider means coupled with its output to said first input of said detector and responsive to the first radio-frequency signal for producing an input signal for the charge-pump phase detector at a frequency half the frequency of the first radio frequency signal coupled to said second input of said detector;

(b) integrating, attenuating and combining means coupled to said detector outputs and responsive to the signals designated D, U and $\overline{D}$, for producing a bipolar D.C. signal equal to D plus 2U minus 3$\overline{D}$; and (c) means coupled to said bipolar DC input producing means and responsive at least in part to the bipolar D.C. signal, for adjusting the frequency of the second radio-frequency signal into phase coincidence with the frequency of the first radio frequency signal.

* * * * *